(12) United States Patent
Lee

(10) Patent No.: US 11,793,045 B2
(45) Date of Patent: Oct. 17, 2023

(54) DISPLAY DEVICE AND MANUFACTURING METHOD THEREOF

(71) Applicant: SAMSUNG DISPLAY CO., LTD., Yongin-si (KR)

(72) Inventor: Sang Hoon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 233 days.

(21) Appl. No.: 17/404,393

(22) Filed: Aug. 17, 2021

(65) Prior Publication Data

US 2022/0173207 A1 Jun. 2, 2022

(30) Foreign Application Priority Data

Dec. 2, 2020 (KR) .................. 10-2020-0166816

(51) Int. Cl.
*H10K 59/18* (2023.01)
*H10K 71/00* (2023.01)

(52) U.S. Cl.
CPC ............. *H10K 59/18* (2023.02); *H10K 71/00* (2023.02); *H10K 71/851* (2023.02)

(58) Field of Classification Search
None
See application file for complete search history.

(56) References Cited

U.S. PATENT DOCUMENTS

2021/0210579 A1* 7/2021 Huang .................. H10K 71/00

FOREIGN PATENT DOCUMENTS

| CN | 113851511 A | * 12/2021 | ......... H01L 23/4985 |
|---|---|---|---|
| CN | 113889512 A | * 1/2022 | ........... H01L 27/322 |
| JP | 7133612 B2 | * 9/2022 | ............. B23K 26/38 |
| KR | 10-2017-0015805 | 2/2017 | |
| KR | 10-2087951 | 4/2020 | |
| KR | 10-2020-0059165 | 5/2020 | |
| KR | 10-2020-0118937 | 10/2020 | |
| WO | 2020-226267 | 11/2020 | |

* cited by examiner

*Primary Examiner* — Michael Lebentritt
(74) *Attorney, Agent, or Firm* — F. Chau & Associates, LLC

(57) ABSTRACT

A display device includes: a substrate; a first insulating layer disposed on the substrate; a wire disposed on the first insulating layer; and a second insulating layer disposed on the wire, wherein the first insulating layer, the wire, and the second insulating layer extend from an edge of the substrate to overlap a side surface of the substrate.

20 Claims, 13 Drawing Sheets

DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2020-01.66816 filed in the Korean Intellectual Property Office on Dec. 2, 2020, the disclosure of which is incorporated by reference herein in its entirety.

TECHNICAL FIELD

This present invention relates to a display device and a manufacturing method thereof.

DISCUSSION OF THE RELATED ART

Typically, display devices such as an organic light emitting diode display and a liquid crystal display include a display panel including a screen on which an image is displayed. The display panels are generally manufactured by forming several layers and elements on a substrate. For example, a tiled display device (e.g., a tiling display device) is a type of display device that implements a relatively large screen by disposing or attaching a plurality of display panels adjacently to each other.

In the tiled display device, a boundary portion (referred to as, e.g., a seam) between the adjacent display panels may be visually recognized and the entire screen may be recognized as a discontinuous screen. For example, if a distance between pixels in the adjacent display panels is about 5 μm or more, a shim may be recognized.

The display panel may include a display area, in which a screen may be formed. In addition, a specific region, for example an edge region, of the display panel may be a non-display area in which a driving circuit, a signal line, etc. are disposed. In general, the non-display area of the display panel is limited to reduce the size of the bezel of the display device and increase the screen-to-body ratio. In addition, the non-display area of the display panel allows the shim to be visually recognized in the tiled display device.

SUMMARY

According to an embodiment of the present invention, a display device includes: a substrate; a first insulating layer disposed on the substrate; a wire disposed on the first insulating layer; and a second insulating layer disposed on the wire, wherein the first insulating layer, the wire, and the second insulating layer extend from an edge of the substrate to overlap a side surface of the substrate.

In an embodiment of the present invention, each of the first insulating layer and the second insulating layer includes an organic insulating material.

In an embodiment of the present invention, the wire and the second insulating layer extend to a lower surface of the substrate.

In an embodiment of the present invention, the first insulating layer does not extend to the lower surface of the substrate.

In an embodiment of the present invention, the substrate includes an inclined surface between the side surface of the substrate and the lower surface of the substrate, and the first insulating layer is in contact with the inclined surface.

In an embodiment of the present invention, the substrate includes an inclined surface between the side surface of the substrate and the lower surface of the substrate, wherein an additional portion is disposed on the inclined surface, and the first insulating layer is in contact with the additional portion.

In an embodiment of the present invention, the display device further includes a buffer layer disposed on the substrate, wherein the first insulating layer is in contact with the buffer layer.

In an embodiment of the present invention, the buffer layer includes a rounded edge, and the first insulating layer, the wire, and the second insulating layer extend to overlap the rounded edge of the buffer layer.

In an embodiment of the present invention, the display device further includes: a transistor disposed on the substrate, wherein the wire is formed of a same material and in a same process as an electrode of the transistor.

In an embodiment of the present invention, the display device further includes: a planarization layer disposed on the transistor, and a pixel definition layer disposed on the planarization layer, wherein the second insulating layer is formed of a same material and in a same process as the planarization layer or the pixel definition layer.

In an embodiment of the present invention, the display device further includes: a display area displaying an image; and a non-display area around the display area, wherein the first insulating layer is disposed in the display area and the non-display area.

In an embodiment of the present invention, the display device further includes: a display area displaying an image; and a non-display area around the display area, wherein the first insulating layer is not disposed in the display area.

According to an embodiment of the present invention, a method of manufacturing a display device includes: forming a first insulating layer, a wire, and a second insulating layer on a substrate; removing a part of the substrate to divide the substrate into a substrate of a first display panel and a substrate of a second display panel; dividing the first insulating layer into a first insulating layer of the first display panel and a first insulating layer of the second display panel; dividing the wire into a wire of the first display panel and a wire of the second display panel; bending parts of the first insulating layer, the wire, and the second insulating layer, of the first display panel, protruding beyond the substrate of the first display panel to at least partially surround an edge of the substrate of the first display panel; and bending parts of the first insulating layer, the wire, and the second insulating layer, of the second display panel, protruding beyond the substrate of the second display panel to at least partially surround an edge of the substrate of the second display panel.

In an embodiment of the present invention, the removing of the part of the substrate includes etching the substrate.

In an embodiment of the present invention, the method of manufacturing the display device further includes forming a buffer layer on the substrate before forming the first insulating layer on the substrate, wherein the buffer layer is etched during the etching of the substrate.

In an embodiment of the present invention, the buffer layer includes an inorganic insulating material, and each of the first insulating layer and the second insulating layer includes an organic insulating material.

In an embodiment of the present invention, the dividing of the first insulating layer includes removing a part of the first insulating layer, and the part of the first insulating layer to be removed is disposed within a region where the part of substrate is removed.

In an embodiment of the present invention, the first insulating layer of the first display panel is in contact with a side surface of the substrate of the first display panel by the bending of parts of the first insulating layer, the wire, and the second insulating layer of the first display panel.

In an embodiment of the present invention, the substrate of the first display panel includes an inclined surface, and the first insulating layer of the first display panel is in contact with the inclined surface by the bending of parts of the first insulating layer, the wire, and the second insulating layer of the first display panel.

In an embodiment of the present invention, the first display panel includes a display area displaying an image and a non-display area around the display area, and the first insulating layer is formed in the display area and the non-display area.

DETAILED DESCRIPTION OF THE EMBODIMENTS

Figure 1:
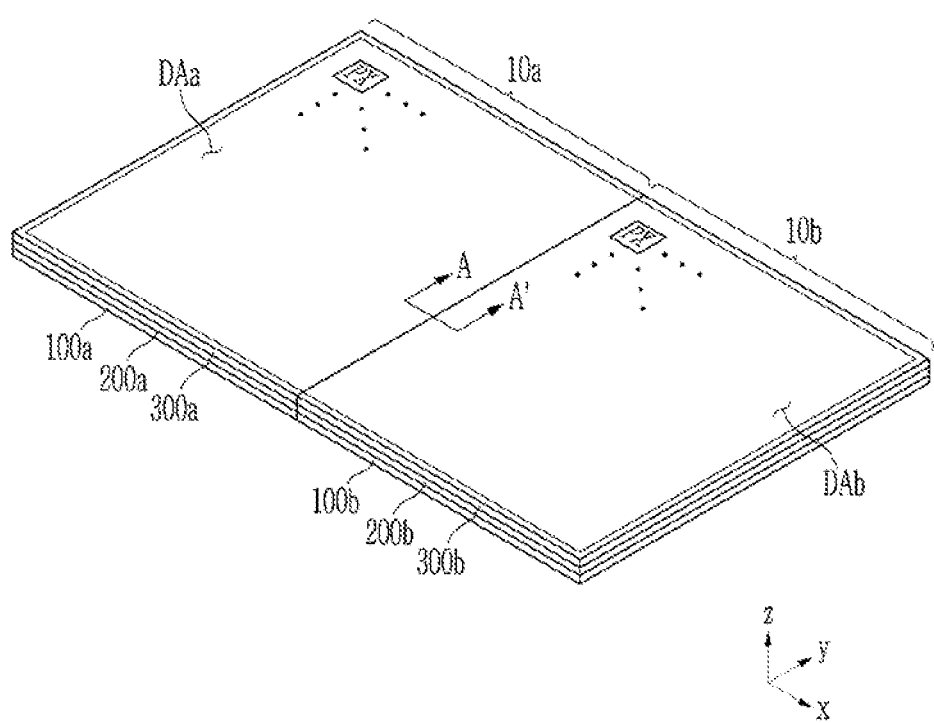
FIG. 1 is a perspective view schematically illustrating a display device according to an embodiment of the present invention.

Hereinafter, embodiments of the present invention will be described in detail with reference to accompanying drawings.

Further, sizes and thicknesses of constituent members shown in the accompanying drawings may be exaggerated for clarity, and the present invention is not limited to the illustrated sizes and thicknesses.

It will be understood that when an element such as a layer, film, area, or substrate is referred to as being "on" another element, it can be directly on the other element or intervening elements may also be present. In addition, when an element is referred to as being "directly on" another element, there are no intervening elements present.

Throughout the specification, "connected" does not only mean that two or more constituent elements are directly connected to each other, but also means that two or more constituent elements are connected indirectly through other constituent elements, and it may include a case where substantially integral parts are connected to each other even if they may be referred to by a different name depending on the position or function, as well as the case of being physically connected or electrically connected.

In the drawings, symbols "x", "y", and "z" representing directions are used, where "x" is a first direction, "y" is a second direction substantially perpendicular to the first direction, and "z" is a third direction substantially perpendicular to the first direction and the second direction. The first direction x, the second direction y, and the third direction z may correspond to a horizontal direction, a vertical direction, and a thickness direction of the display device, respectively.

Figure 2:
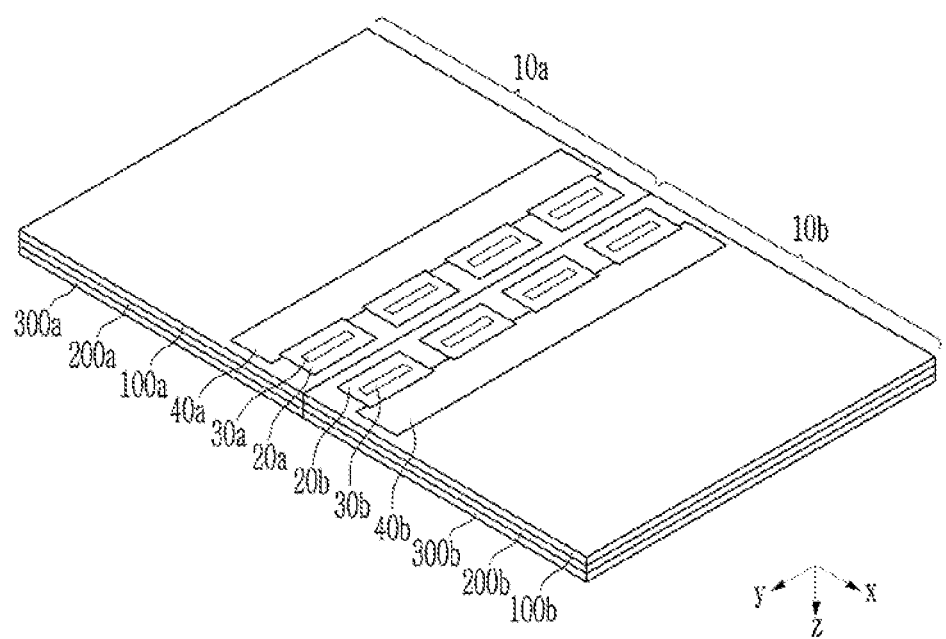
FIG. 2 is a perspective view illustrating a rear surface of a display device shown in FIG. 1.

FIG. 1 is a perspective view schematically illustrating a display device according to an embodiment of the present invention, and FIG. 2 is a perspective view illustrating a rear surface of a display device shown in FIG. 1.

Referring to FIG. 1 and FIG. 2, the display device may include a first display panel 10$a$ and a second display panel 10$b$ disposed close to each other. One side surface of the first display panel 10$a$ and one side surface of the second display panel 10$b$ may be in contact with each other. For example, the display device may further include a display panel in addition to the first and second display panels 10$a$ and 10$b$. For example, the display device may include only one of the first and second display panels 10$a$ and 10$b$.

The first display panel 10$a$ may have a structure in which a substrate 100$a$, a display layer 200$a$, and an encapsulation layer 300$a$ are stacked. The second display panel 10$b$ may also have a structure in which a substrate 100$b$, a display layer 200$b$, and an encapsulation layer 300$b$ are stacked.

The substrates 100$a$ and 100$b$ are layers that serve as a basis for forming the display layers 200$a$ and 200$b$, and may be made of an insulating material such as glass. The substrates 100$a$ and 100$b$ may be plastic substrates including polymers such as polyimide and polyamide. The substrates 100$a$ and 100$b$ may each have a multi-layered structure, and for example, may include two polymer layers and a barrier layer between the two polymer layers. However, the present invention is not limited thereto, and the substrates 100$a$ and 100$b$ may each have a single layer. The substrate 100$a$ and the substrate 100$b$ are separated from each other.

The display layers 200$a$ and 200$b$ may include display elements and circuit elements for driving them. For example, when the display device is an emissive display device, the display layers 200$a$ and 200$b$ may include a light emitting diode (LED) (e.g., an organic light emitting diode or an inorganic light emitting diode (LED)) as a display element. For example, the circuit elements may include transistors, capacitors, wires (e.g., signal lines), etc. The display layers 200$a$ and 200$b$ may also include insulating layers for insulating light-emitting elements and/or circuit elements.

The encapsulation layers 300$a$ and 300$b$ cover the display layers 200$a$ and 200$b$ to protect the display layers 200$a$ and 200$b$ from external environments and impurities. For example, the encapsulation layers 300$a$ and 300$b$ may prevent moisture and oxygen from penetrating into the display layers 200$a$ and 200$b$.

The first display panel 10$a$ includes the first display area DAa on the front surface (e.g., a surface that provides the screen) of the first display panel 10$a$, and the second display panel 10$b$ includes the second display area DAb on the front surface of the second display panel 10$b$.

In the first display area DAa and the second display area DAb, the pixels PX, for example, may be disposed in a matrix. In addition, the first display area DAa and the second display area DAb may display an image by the combination of the pixels PX. In the case of an emissive display device, the pixel PX may be implemented by a light emitting diode (LED).

In the first display area DAa and the second display area DAb, signal lines such as data lines, gate lines, and the like may be disposed. The gate lines may extend approximately in the first direction x (e.g., a row direction), and the data lines may extend in the second direction y (e.g., a column direction) intersecting the first direction x. Each of the pixels PX are connected to a gate line and a data line, and a gate signal and a data voltage (also called, e.g., a data signal) may be applied from these signal lines. In the case of an emissive display device, in the first display area DAa and the second display area DAb, driving voltage lines transmitting a driving voltage to the pixels PX may be disposed, and light emission control lines transmitting a light emission control signal and/or initialization voltage lines transmitting an initialization voltage may be disposed in the first display area DAa and the second display area DAb. The pixels PX, the signal lines, and the like disposed in the first display area DAa and the second display area DAb may be positioned on the display layers 200a and 200b.

The first display panel 10a may include a non-display area around the first display area DAa, and the second display panel 10b may include a non-display area around the second display area DAb. The non-display area is a region that does not display the image. In the non-display area, elements and/or wires for generating and/or transmitting various signals applied to the first display area DAa and the second display area DAb may be disposed.

The first display area DAa and the second display area DAb are combined to form the screen of the display device. The non-display area does not substantially exist between the first display area DAa and the second display area DAb, and the first display area DAa and the second display area DAb may be continuous. For example, the pixels PX of the first display area DAa and the pixels PX of the second display area DAb may be disposed sufficiently close. Accordingly, when the image is displayed on the screen of the display device, the boundary portion between the first display panel 10a and the second display panel 10b (for example, the boundary portion between the first display area DAa and the second display area DAb) may not be visible. The specific configuration related thereto is described later.

The display device may include a flexible circuit board 20a, an integrated circuit chip 30a, and a printed circuit board (PCB) 40a positioned on the rear surface of the first display panel 10a.

One end of the flexible circuit board 20a may be bonded to the pads positioned on the back of the first display panel 10a and may be electrically connected thereto. For example, for this mechanical and electrical bonding, an anisotropic conductive layer may be positioned between the flexible circuit board 20a and the pads. The pads may be positioned near the boundary portion between the first display panel 10a and the second display panel 10b, and accordingly, the flexible circuit board 20a may also be positioned near the boundary portion and may be disposed along the second direction y in the approximate central portion of the display device. The other end of the flexible circuit board 20a may be bonded to the printed circuit board (PCB) 40a and may be electrically connected to the printed circuit board (PCB). Depending on the size of the first display panel 10a, a plurality of flexible circuit boards 20a may be bonded to the printed circuit board (PCB).

The integrated circuit chip 30a may be mounted on the flexible circuit board 20a. The integrated circuit chip 30a may include a driving device for driving the first display panel 10a. The integrated circuit chip 30a may also be referred to as a driving IC. The integrated circuit chip 30a may output the signals provided to the first display area DAa. For example, the integrated circuit chip 30a may output a data voltage, a driving voltage, a common voltage, an initialization voltage, and the like. The signals output by the integrated circuit chip 30a may be input to the first display panel 10a through the flexible circuit board 20a.

On the printed circuit board (PCB) 40a, a processor (e.g., a graphics processing unit), a memory, etc. may be positioned. The integrated circuit chip 30 may receive the signals (e.g., image data and signals related thereto, power, etc.) that are a basis for generating the above signals from the printed circuit board (PCB) 40a through the flexible circuit board 20a.

Typically, the pads are positioned on the front surface edge of the first display panel 10a and the flexible circuit board 20a is bonded to those pads. As in an embodiment of the present invention, the pads are positioned on the rear surface of the first display panel 10a and the flexible circuit board 20a is bonded to the rear surface of the first display panel 10a, thereby reducing the size of the non-display area on the front surface of the first display panel 10a.

The display device may include a flexible circuit board 20b, an integrated circuit chip 30b, and a printed circuit board (PCB) 40b disposed on the rear surface of the second display panel 10b. The flexible circuit board 20b, the integrated circuit chip 30b, and the printed circuit board (PCB) 40b may be the substantially same as the flexible circuit board 20a, the integrated circuit chip 30a, and the printed circuit board (PCB) 40a positioned on the rear surface of first display panel 10a in structure and functionality, respectively, and a description thereof is omitted.

The display device may include a driving device for driving the first display panel 10a and the second display panel 10b. The driving device may include a data driver that applies a data voltage to data lines, a gate driver that applies a gate signal to the gate lines, and a signal controller that controls the data driver and the gate driver. The pixels PX may receive a data voltage or an initialization voltage at predetermined timing according to the gate signal generated by the gate driver. The gate driver may be integrated on the first display panel 10a and the second display panel 10b or may be provided as an integrated circuit chip mounted thereon. The data driver may be provided as an integrated circuit chip 30a and 30b. The signal controller may be provided as an integrated circuit chip and may be mounted on a printed circuit board (PCB) 40a and 40b. The data driver and the signal controller may be provided as an integrated chip.

The flexible circuit board 20a, the integrated circuit chip 30a, and the printed circuit board (PCB) 40a of the first display panel 10a and the flexible circuit board 20b, the integrated circuit chip 30b, and printed circuit board (PCB) 40b of the second display panel 10b may be disposed symmetrically with respect to the boundary portion of the first display panel 10a and the second display panel 10b. For example, the flexible circuit board 20a and the integrated circuit chip 30a of the first display panel 10a and the flexible circuit board 20b and the integrated circuit chip 30b of the second display panel 10b may be disposed close to or adjacent to the boundary portion of the first display panel 10a and the second display panel 10b.

So far, the overall configuration of the display device has been described. Now, the configuration of the boundary portion of the first display panel 10a and the second display panel 10b is described in detail with reference to FIG. 3.

Figure 3:
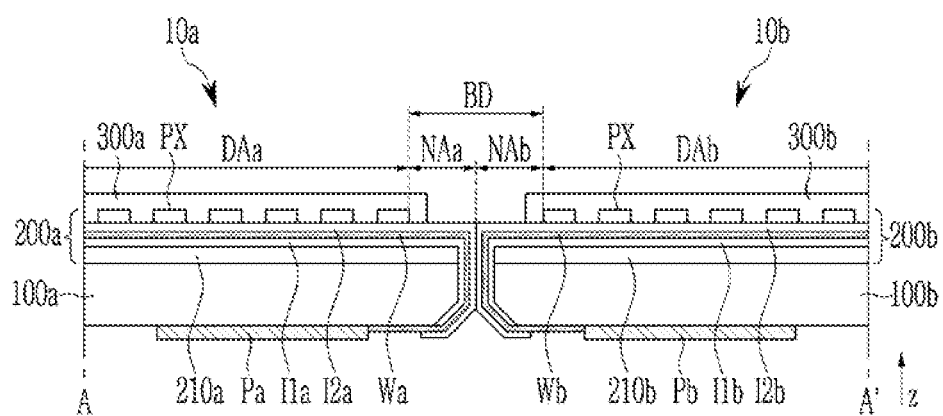
FIG. 3 is a schematic cross-sectional view of an embodiment of the present invention taken along a line A-A' in FIG. 1.

FIG. 3 is a schematic cross-sectional view taken along a line A-A' of FIG. 1 according to an embodiment of the present invention. To clearly indicate the features of an embodiment of the present invention, in FIG. 3, the configurations related to the features of an embodiment of the present invention are mainly illustrated and the remaining configurations might not be illustrated or may be illustrated briefly.

Referring to FIG. 3, the cross-sectional view of an edge of the first display panel 10a and an edge of the second display panel 10b facing each other is schematically shown. The first display panel 10a may include the first display area DAa and the non-display area NAa, and the second display panel 10b may include the second display area DALb and the non-display area NAb. The pixels PX may be positioned in the first display area DAa and the second display area DAb. The pixels PX may include a red pixel, a green pixel, and a blue pixel. The pixels PX may further include a white pixel and may include the pixels representing primary colors other than red, green, and blue.

The non-display areas NAa and Nab of the first display panel 10a and the second display panel 10b facing each other may configure the boundary portion BD of the first display area DAa and the second display area DAb. The width of boundary portion BD may correspond to the interval between the first display area DAa and the second display area DAb, for example the interval between the pixel PX positioned at the rightmost position in the first display panel 10a and the pixel PX positioned at the leftmost position in the second display panel 10b. The width of the boundary portion BD may be within about 5 μm so that the boundary portion BD is not visible when the image is displayed in the first display area DAa and the second display area DALb.

The first display panel 10a may include a substrate 100a, a buffer layer 210a, a first insulating layer I1a, a wire Wa, a second insulating layer I2a, pixels PX, and an encapsulation layer 300a. The buffer layer 210a, the first insulating layer I1a, the wire Wa, the second insulating layer I2a, the pixels PX, and the encapsulation layer 300a may be sequentially positioned on the substrate 100a. The buffer layer 210a, the first insulating layer I1a, the wire Wa, the second insulating layer I2a, and the pixels PX may form the display layer 200a.

The substrate 10a may be a glass substrate or a plastic substrate. The edge of the substrate 100a facing the second display panel 10b may be cut to be inclined toward the rear surface of the first display panel 10a. For example, the substrate 100a may include an inclined surface between the side surface and the lower surface. In the substrate 100a, the side surface and the lower surface may correspond to the side surface and the rear surface of the first display panel 10a.

The buffer layer 210a on the substrate 100a may include an inorganic insulating material such as a silicon nitride (SiNx), a silicon oxide (SiOx), and a silicon oxynitride (SiOxNy), and may be a single layer or a multiple layer.

On the buffer layer 210a, the wire Wa may be disposed between the first insulating layer I1a and the second insulating layer I2a. The wire Wa may be disposed in the non-display area NAa of the first display panel 10a. One wire Wa is shown due to a nature of the cross-section diagram, but a plurality of wires Wa may be positioned in the non-display area NAa. The wire Wa is shown continuously from the non-display area NAa to the first display area DAa, but this is to indicate that the wire Wa may be formed on the same layer. For example, the wire Wa may be formed of the same material and in the same process as the wire or the signal line positioned in the first display area DAa. For example, the wire Wa may be formed continuously on the first insulating layer I1a. The wire Wa may be electrically connected to the wire or the signal line positioned in the first display area DAa and may extend to the first display area DAa.

The wire Wa may be bent along the edge of the substrate 100a together with the first insulating layer I1a and the second insulating layer I2a. For example, the wire Wa, the first insulating layer I1a, and the second insulating layer I2a may be bent to be positioned on the upper surface, the side surface, and the inclined surface of the substrate 100a. The first insulating layer I1a may be in contact with the buffer layer 210a on the upper surface of the substrate 100a. The first insulating layer I1a may be in contact with the side surface and the inclined surface of the substrate 100a. For example, the first insulating layer I1a may be positioned between the side surface of the substrate 100a and the wire Wa and between the inclined surface of the substrate 100a and the wire Wa.

The wire Wa passes over the inclined surface of the substrate 100a and is positioned on the lower surface of the substrate 100a, but the first insulating layer I1a and/or the second insulating layer I2a may not be positioned on the lower surface of the substrate 100a. For example, the wire Wa may be in contact with the lower surface of the substrate 100a, and at the rear surface of the first display panel 10a, the wire Wa may include a portion exposed by the second insulating layer I2a. As an additional example, the second insulating layer I2a may be disposed on a portion of the lower surface of the substrate 100a. Unlike as shown, the first insulating layer I1a may be positioned between the wire Wa and the lower surface of the substrate 100a.

The wire Wa may include a metal or metal alloys such as copper (Cu), aluminum (Al), silver (Ag), chromium (Cr), titanium (Ti), and/or tantalum (Ta). The first insulating layer I1a and the second insulating layer I2a may be organic insulating layers. The first insulating layer I1a and the second insulating layer I2a may include an organic insulating material such as commonly used polymers of, for example, polymethyl methacrylate or polystyrene, polymer derivatives having phenolic groups, acryl-based polymers, imide polymers (e.g., polyimide), acryl-based polymers, and/or siloxane-based polymers.

Since the first insulating layer I1a and the second insulating layer I2a, which are the organic insulating layers, are positioned on both sides of the wire Wa, the first insulating layer I1a and the second insulating layer I2a may protect the wire Wa and the stress of the wire may be relieved or reduced.

On the lower surface of the substrate 100a, a pad Pa connected to the wire Wa may be positioned. The above-described flexible circuit board 20a may be mechanically and electrically bonded to such a pad Pa.

The second display panel 10b may include a substrate 100b, a buffer layer 210b, a first insulating layer I1b, wiring wire Wb, a second insulating layer I2b, pixels PX, and an encapsulation layer 300b. The buffer layer 210b, the first insulating layer I1b, the wire Wb, the second insulating layer I2b, the pixels PX and the encapsulation layer 300b may be sequentially positioned on the substrate 100b. The buffer layer 210b, the first insulating layer I1b, the wire Wb, the second insulating layer I2b, and the pixels PX may form the display layer 200b. The wire Wb may be bent along the edge of the substrate 100b together with the first insulating layer I1b and the second insulating layer I2b. On the lower surface of the substrate 100b, the pad Pb connected to the wire Wb may be positioned. The flexible circuit board 20b may be mechanically and electrically bonded to this pad Pb.

Since the features of the constituent elements of the second display panel 10b may be substantially the same as those of the corresponding constituent elements of the first display panel 10a, a detailed description of the second display panel 10b is omitted.

Since the pads Pa and Pb for the bonding of the flexible circuit boards 20a and 20b are located on the rear surface of the display panels 10a and 10b such that they overlap the first and second display areas DAa and DAb, respectively, and do not overlap the non-display areas NAa and NAb of the front surface of the first display panel 10a and the second display panel 10b, the width of the non-display areas NAa and NAb may be reduced. Accordingly, the width of the boundary portion BD of the first display panel 10a and the second display panel 10b may be reduced to less than about 5 μm, for example, and the boundary portion BD may be prevented from being visually recognized, or may be hardly visible.

Figure 4:
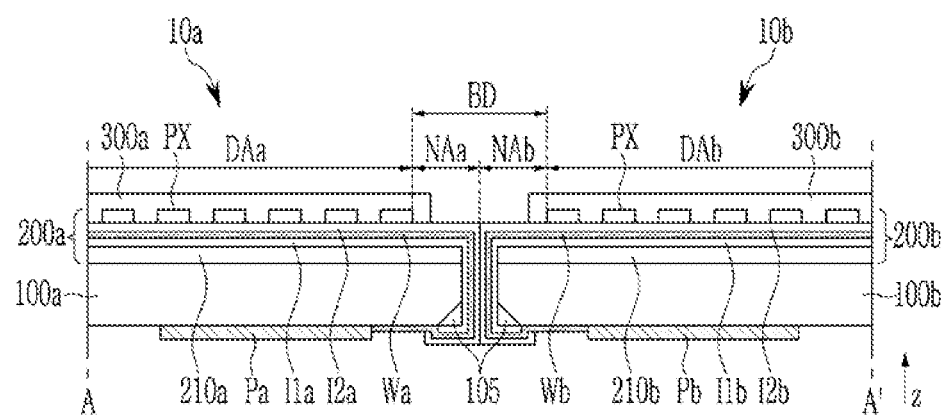
FIG. 4 is a schematic cross-sectional view of an embodiment of the present invention taken along a line A-A' in FIG. 1.
Figure 5:
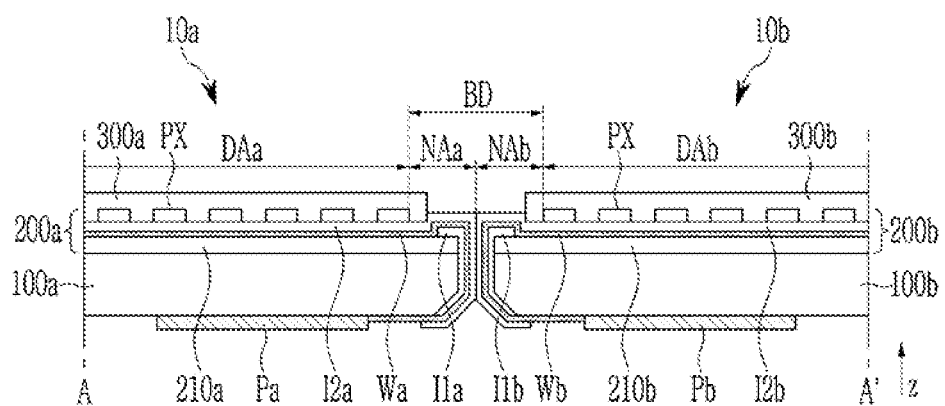
FIG. 5 is a schematic cross-sectional view of an embodiment of the present invention taken along a line A-A' in FIG. 1.

FIG. 4 and FIG. 5 are cross-sectional views of an embodiment of the present invention taken along a line A-A' in FIG. 1. For the embodiment of FIG. 4 and FIG. 5, the differences from the embodiment of FIG. 3 are mainly described.

Referring to FIG. 4, an additional portion 105 may be positioned on the inclined surface of the edge of the substrate 100a of the first display panel 10a facing the second display panel 10b. The additional portion 105 may have an approximately triangular cross-section shape as shown, but it may have an approximately semicircular cross-section shape. For example, the additional portion 105 may be the same material as the substrate 100a or may have a different material from the substrate 100a. The inclined surface of the edge of the substrate 100a may be the result of cutting (e.g., chemical cleavage using wet etching), and the inclined surface of the substrate 100a may be removed by providing an additional portion 105 to this inclined surface. Like the first display panel 10a, an additional portion 105 may be provided on the inclined surface of the substrate 100b of the second display panel 10b. By removing the inclined surface in this way, the wires Wa and Wb may be bent to a larger curvature radius and the bending stress of the wires Wa and Wb may be relieved or reduced.

Referring to FIG. 5, in the first display panel 10a, the first insulating layer I1a is not disposed in the first display area DAa, and may be disposed in the non-display area NAa. For example, the first insulating layer I1a may be only disposed in the non-display area NAa. In addition, in the second display panel 10b, the first insulating layer I1b may not be positioned on the second display area DAb, but may be disposed on the non-display area NAb. For example, the first insulating layer I1b may be only disposed on the non-display area Nab. According to the embodiment of FIG. 5, the first insulating layers I1a and I1b may be formed to protect the wires Wa and Wb without being disposed in the first display area DAa and the second display area DAb. For example, the first insulating layer I1a and I1b may not change the design of the first display area DAa. However, for example, an additional process step may be implemented to form the first insulating layers I1a and I1b only in the non-display areas NAa and DAb.

FIG. 6, FIG. 7, FIG. 8, FIG. 9, and FIG. 10 are cross-sectional views illustrating a method of manufacturing a display device according to an embodiment of the present invention. The manufacturing method of the display device shown in FIG. 3, for example, is described with reference to FIG. 6 to FIG. 10.

Figure 6:
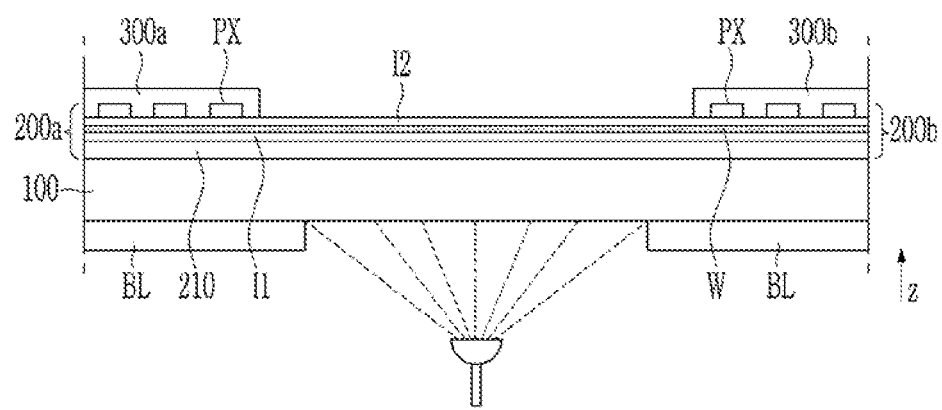
FIGS. 6, 7, 8, 9, and 10 are cross-sectional views illustrating a method of manufacturing a display device according to an embodiment of the present invention.

Referring to FIG. 6, the first display panel 10a and the second display panel 10b may be manufactured by using one substrate 100. For example, display layers 200a and 200b and encapsulation layers 300a and 300b may be formed on the substrate 100. The formation of the display layers 200a and 200b may include forming a buffer layer 210, a first insulating layer I1, a wire W, a second insulating layer I2, and pixels PX on the substrate 100.

Then, a blocking layer BL covering the region corresponding to the first display panel 10a and the region corresponding to the second display panel 10b is formed on the lower surface of the substrate 100, and the portion of the substrate 100 not covered by the blocking layer BL may be etched to be removed. The portion of the substrate 100 that is not covered by the blocking layer BL may be approximately a central portion of the substrate 100 and may be positioned across the second direction y. As to the etching method, wet etching such as a spray method may be used, for example.

Figure 7:
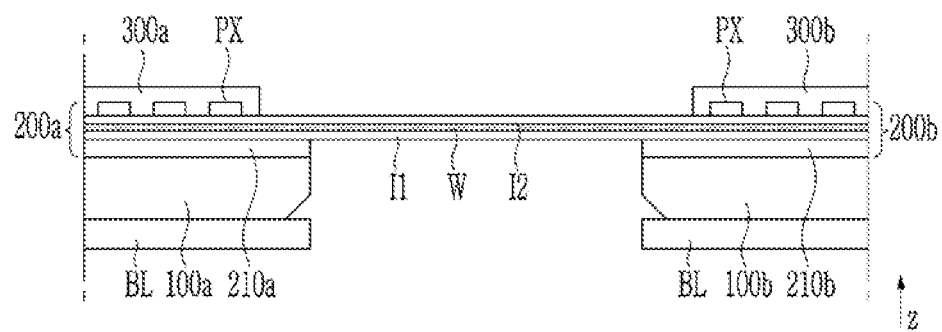

Referring to FIG. 7, a buffer layer, which is an inorganic insulating layer, may be etched due to a characteristic of an etchant for etching the substrate 100 (e.g., as a hydrofluoric etchant, including hydrofluoric acid (HF), hydrochloric acid (HC), and/or phosphoric acid ($H_3PO_4$)). Therefore, by etching the substrate 100 and the buffer layer 210 in a single etching process, the substrate 100a and the buffer layer 210a of the first display panel 10a may be separated from the substrate 100b and the buffer layer 210b of the second display panel 10b. However, the first insulating layer I1 of the organic insulating layer may not be etched, and as the wire W is covered by the first insulating layer I1, it may not be etched. Due to the isotropy of wet etching, an inclined surface may be formed on the edges of the substrates 100a and 100b. Although the inclined surface is shown as a straight line in an oblique direction, the inclined surface may be a curved surface or an uneven surface.

Figure 8:
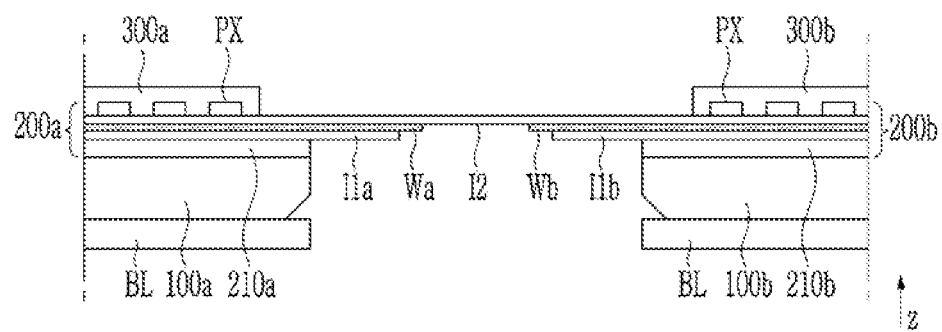

Referring to FIG. 8, the first insulating layer I1 may be separated into a first insulating layer I1a of the first display panel 10a and a first insulating layer I1b of the second display panel 10b by removing a part of the first insulating layer I1 by a method such as ashing. The removed portion of the first insulating layer I1 may be from a region in which a portion of the substrate 100 is removed. For example, the opening formed in the first insulating layer I1, which was formed in the removal process of the first insulating layer I1, may overlap the opening formed in the substrate 100, which was formed in the etching process in FIG. 7.

Then, a part of the wire W exposed by the removal of the first insulating layer I1 may be removed or cut by a method such as etching, thereby being separated into the wire Wa of the first display panel 10a and the wire Wb of the second display panel 10b. The width of the region from which the first insulating layer I1 is removed may be narrower than the width of the region from which the substrate 100 is removed. The width of the region from which wire W is removed may be narrower than the width of the region from which the first insulating layer I1 is removed.

In this way, by etching or removing the parts of the substrate 100, the first insulating layer I1, and the wire W between the first display panel 10a and the second display panel 10b, the first insulating layer I1a and the wire Wa of the first display panel 10a may be protruded from the edge of the substrate 100a toward the second display panel 10b. In addition, the first insulating layer I1b and the wire Wb of the second display panel 10b may be protruded from the edge of the substrate 100b toward the first display panel 10a. The protruded length of the first insulating layer I1a and the wire Wa may be greater than or equal to the thickness of the substrate 100a, and the protruded length of the first insulating layer I1b and the wire Wb may be greater than or equal to the thickness of the substrate 100b.

Figure 9:
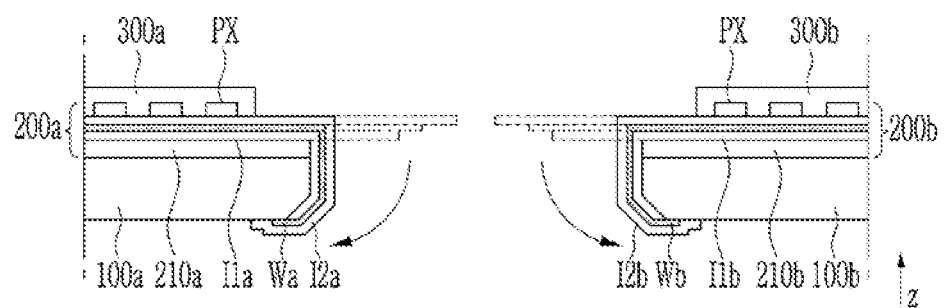

Referring to FIG. 9, the second insulating layer I2 may be cut or removed to be separated into the second insulating layer I2a of the first display panel 10a and the second insulating layer I2b of the second display panel 10b. Accordingly, the portions of the first insulating layer I1a, the wire Wa, and the second insulating layer I2a protruded from the substrate 100a form the bending part.

Then, the protruded portions of the first insulating layer I1a, the wire Wa, and the second insulating layer I2a, that is, the bending portions, may be bent to at least surround the edge of the substrate 100a. At this time, the first insulating layer I1a may be bent to be in contact with the side surface and the inclined surface of the substrate 100a. The wire Wa and the second insulating layer I2a may be bent to extend past the inclined surface of the substrate 100a to the lower surface of the substrate 100a. After bending, the second insulating layer I2a on the lower surface of the substrate 100a may cover the edge of the wire Wa. After that, the part of the second insulating layer I2a can be removed so that the edge of the wire Wa is exposed. Similarly, the protruded parts (e.g., the bending part) of the first insulating layer I1b, the wire Wb, and the second insulating layer I2b corresponding to the second display panel 10b may be bent to at least partially surround the edge of the substrate 100b, and the part of the second insulating layer I2b may be removed so that the edge of the wire Wb is exposed after bending.

In an embodiment of the present invention, the second insulating layer I2 may be bent without cutting and the second insulating layer I2 may be cut after bending by using, for example, a laser or the like. The first insulating layers I1a and I1b may extend to the lower surfaces of the substrates 100a and 100b.

Figure 10:
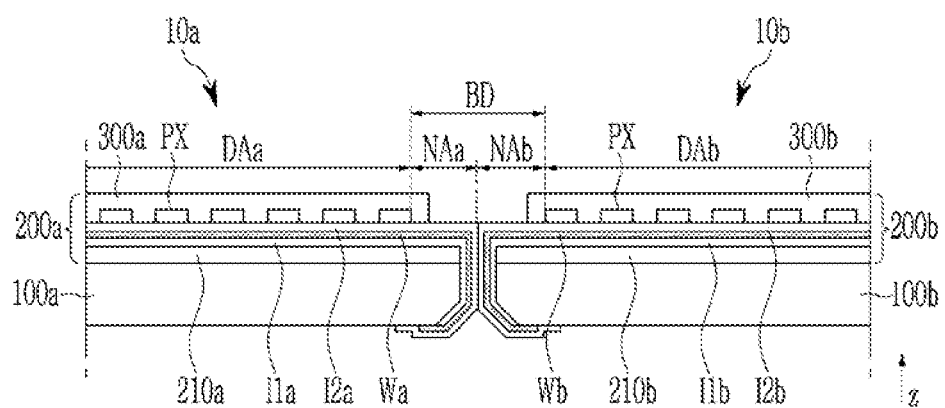

Referring to FIG. 10, the edges of the first display panel 10a and the second display panel 10b may be assembled to be in contact with each other. Referring to FIG. 3, on the lower surfaces of the substrates 100a and 100b, the pads Pa and Pb, which are electrically connected to the exposed parts of wires Wa and Wb, may be formed for each display panel 10a and 10b before assembling the first display panel 10a and second display panel 10b. It is also possible to use each display panel 10a and 10b alone without assembling the first display panel 10a and the second display panel 10b.

Figure 11:
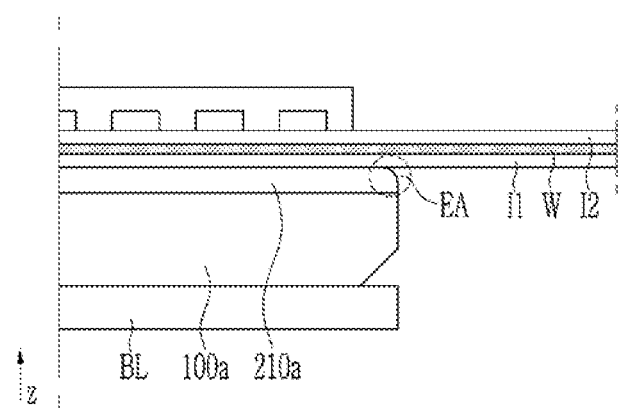
FIG. 11 and FIG. 12 are cross-sectional views illustrating a method of manufacturing a display device according to an embodiment of the present invention.
Figure 12:
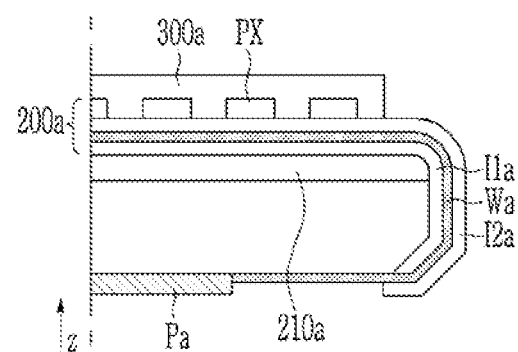

FIG. 11 and FIG. 12 are cross-sectional views illustrating a method of manufacturing method of a display device according to an embodiment of the present invention.

FIG. 11 represents a process step similar to that shown in FIG. 7. When etching the substrate 100 and the buffer layer 210, if the etching process is controlled using the characteristic of the wet etching, that is, the isotropy (e.g., by increasing the etching time), the edge FA of the buffer layer 210a may be etched to be rounded or inclined. When the edge EA of buffer layer 210a is formed to be rounded, as shown in FIG. 12, the bending portion of the first insulating layer I1a, the wire Wa, and the second insulating layer I2a may be bent more gently while at least partially surrounding the rounded edge EA of the buffer layer 210a and the bending stress of the wire Wa may be reduced. In addition, the overall curvature radius of the bending portion may be reduced and the width of the non-display area may be reduced.

Figure 13:
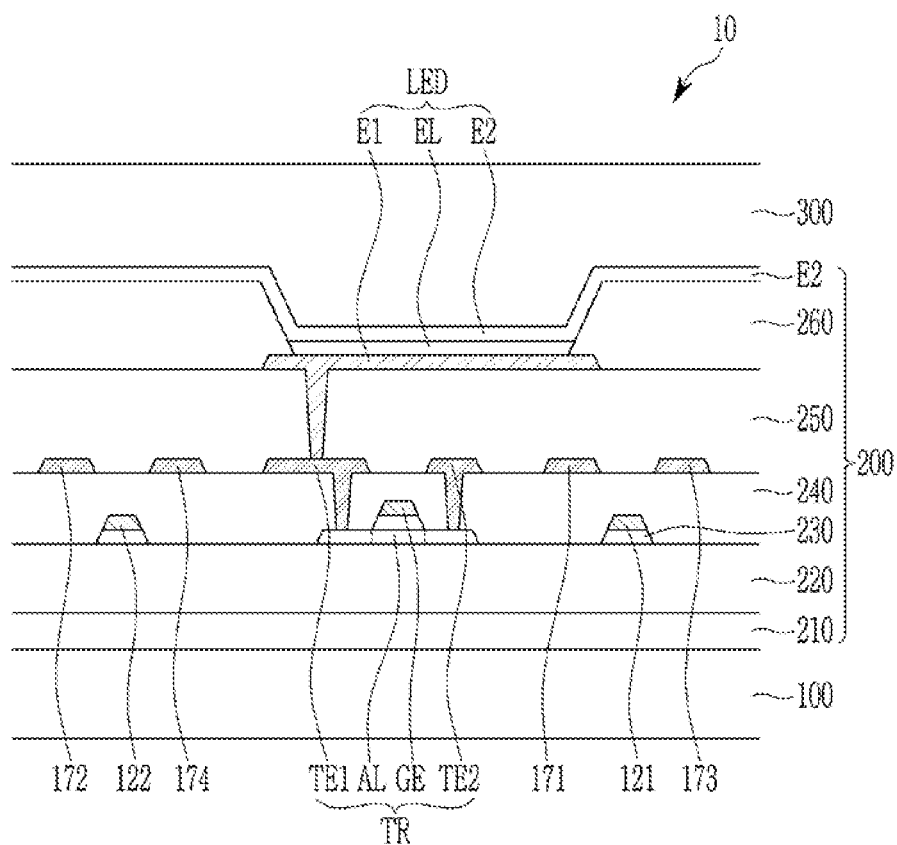
FIG. 13 is a schematic cross-sectional view of a display area in a display device according to an embodiment of the present invention.

FIG. 13 is a schematic cross-sectional view of a display area in a display device according to an embodiment of the present invention. The cross-section shown in FIG. 13 may correspond to approximately one pixel area. The display panel 10 may correspond to the first display panel 10a and/or the second display panel 10b shown in FIG. 1.

The display panel 10 includes a substrate 100 and a display layer 200 formed or stacked on the substrate 100. The substrate 100 may be an insulation substrate such as glass or plastic and may have a single layer or a multi-layered structure.

A buffer layer 210 may be positioned on the substrate 100. The buffer layer 210 may block an impurity that may diffuse from the substrate 100 to the semiconductor layer AL in the process of forming the semiconductor layer AL and may reduce the stress applied to the substrate 100. The buffer layer 210 may include an inorganic insulating material such as a silicon nitride (SiNx), a silicon oxide (SiOx), and a silicon oxynitride (SiOxNy), and may be a single layer or a multi-layered structure.

A barrier layer that may include an inorganic insulating material may be positioned between the substrate 100 and the buffer layer 210. The buffer layer 210 may also be referred to as a barrier layer.

An organic insulating layer 220 may be positioned on the buffer layer 210. The organic insulating layer 220 may correspond to the first insulating layers I1a and I1b positioned on the buffer layers 210a and 210b in the embodiments of FIG. 3 to FIG. 5. For example, the first insulating layers I1a and I1b may be formed of the same material and in the same process as the organic insulating layer 220. However, since the organic insulating layer 220 is not positioned in the display area in the structure of the embodiment of FIG. 5, the organic insulating layer 220 may not be positioned in regions corresponding to each pixel in the pixel area of the display area.

A semiconductor layer AL may be disposed on the organic insulating layer 220. The semiconductor layer AL may include a channel region of a transistor TR and a first region and a second region on both sides of the channel region. The semiconductor layer AL may include, for example, any one of amorphous silicon, polysilicon, and/or an oxide semiconductor. For example, the semiconductor layer AL may include a low temperature polysilicon (LTPS) or an oxide semiconductor material including at least one of, for example, zinc (Zn), indium (In), gallium (Ga), and/or tin (Sn). For example, the semiconductor layer may include an IGZO (indium-gallium-zinc oxide).

A gate insulating layer 230 may be positioned on the semiconductor layer AL. The gate insulating layer 230 may include inorganic insulating materials such as a silicon nitride (SiNx), a silicon oxide (SiOx), and a silicon oxynitride (SiOxNy) and may be a single layer or a multi-layered structure.

A gate conductive layer that may include a gate electrode GE of the transistor TR, a first gate line 121, a second gate line 122, etc. may be positioned on the gate insulating layer 230. The gate conductive layer may include, for example, molybdenum (Mo), aluminum (Al), copper (Cu), titanium (Ti), and the like, and may be a single layer or a multi-layered structure. The wires Wa and Wb described above may be formed with the gate conductive layer. For example, the wires Wa and Wb may be formed of the same material and in the same process as the gate electrode GE.

An interlayer insulating layer 240 may be positioned on the gate conductive layer. The interlayer insulating layer 240 may include inorganic insulating materials such as a silicon nitride (SiNx), a silicon oxide (SiOx), and a silicon oxynitride (SiOxNy), and may be a single layer or a multi-layered structure.

A data conductive layer that may include a first electrode TE1 and a second electrode TE2 of the transistor TR, a data line 171, a driving voltage line 172, a common voltage line 173, an initialization voltage line 174, etc. may be positioned on the interlayer insulating layer 240. One of the first electrode TE1 and the second electrode TE2 may be the source electrode of the transistor TR and the other may be the drain electrode of the transistor TR. The data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), and/or copper (Cu), etc., and may be a single-layered or multi-layered structure. The wires Wa and Wb described above may be formed of the data conductive layer. For example, the wires Wa and Wb may be formed of the same material and in the same process as the first electrode TE1 and the second electrode TE2. However, the present invention is not limited thereto. For example, the wires Wa and Wb may be formed of a different material and/or in a different process than that of the first electrode TE1 and the second electrode TE2.

A planarization layer 250 may be positioned on the data conductive layer. The planarization layer 250 may be an organic insulating layer. For example, the planarization layer 250 may include an organic insulating material such as commonly used polymers of polymethyl methacrylate or polystyrene, polymer derivatives having phenolic groups, acryl-based polymers, imide polymers (e.g., polyimide), acryl-based polymers, and siloxane-based polymers. The planarization layer 250 may correspond to the second insulating layers I2a and I2b disposed on the wire Wa and Wb in the embodiments of FIG. 3 to FIG. 5. For example, the second insulating layers I2a and I2b may be formed of the same material and in the same process as the planarization layer 250.

A passivation layer that may include inorganic insulating materials such as a silicon nitride (SiNx), a silicon oxide (SiOx), and a silicon oxynitride (SiOxNy) may be disposed between the data conductive layer and the planarization layer 250.

A first electrode E1 of the light emitting diode LED may be positioned on the planarization layer 250. The first electrode E1 may be referred to as a pixel electrode. The first electrode E1 may be connected to the first electrode TE1 through a contact hole formed in the planarization layer 250. The first electrode E1 may be formed of a reflective conductive material or a transflective conductive material, or may be formed of a transparent conductive material. The first electrode E1 may include a transparent conductive material such as indium tin oxide (ITO) or indium zinc oxide (IZO). The first electrode E1 may include a metal or metal alloy such as lithium (Li), calcium (Ca), aluminum (Al), silver (Ag), magnesium (Mg), and/or gold (Au).

A pixel definition layer 260 having an opening overlapping the first electrode E1 may be positioned above the planarization layer 250. The pixel definition layer 260 may be referred to as a partition. The pixel definition layer 260 may include an organic insulating material such as an acryl-based polymer or an imide-based polymer. The second insulating layers I2a and I2b described above may be formed of the same material and in the same process as the organic insulating layer 220. However, for example, in the structure like the embodiment of FIG. 5, since the organic insulating layer 220 is not disposed in the display area, the organic insulating layer 220 may not be disposed in the pixel area (e.g., the region corresponding to each pixel in the display area). However, the present invention is not limited thereto. For example, the organic insulating layer 220 may be disposed in the display area.

An emission layer EL may be positioned on the first electrode E1. In addition to the emission layer EL, at least one of a hole injection layer, a hole transport layer, an electron transport layer, and an electron injection layer may be positioned on the first electrode E1.

A second electrode E2 may be positioned on the emission layer EL. The second electrode E2 may be positioned over several pixels. The second electrode E2 may be referred to as a common electrode. The second electrode E2 may have light transmittance by forming a relatively thin layer of a metal or a metal alloy having a low work function such as calcium (Ca), barium (Ba), magnesium (Mg), aluminum (Al), silver (Ag), or the like. The second electrode E2 may include a transparent conductive oxide such as an indium tin oxide (ITO) or an indium zinc oxide (IZO).

The first electrode E1, the emission layer EL, and the second electrode E2 of each pixel form the light emitting diode LED such as an organic light emitting diode. The first electrode E1 may be an anode of the light emitting diode LED and the second electrode E2 may be a cathode of the light emitting diode LED. In an embodiment of the present invention, the light emitting diode LED may be provided in a form of a chip, and the display panel 10 may include electrode pads connected to the light emitting diode LED.

An encapsulation layer 300 may be positioned on the second electrode E2. The encapsulation layer 300 may be a thin film encapsulation layer in which at least one inorganic layer and at least one organic layer are stacked. For example, the encapsulation layer 300 may be a glass substrate bonded to the substrate 100 by a sealant.

A color conversion layer including semiconductor nanocrystals (e.g., quantum dots, phosphors, etc.) may be positioned on the encapsulation layer 300 or between the light emitting diode LED and the encapsulation layer 300.

While the present invention has been shown and described with reference to the embodiments thereof, it will be apparent to those of ordinary skill in the art that various changes in form and detail may be made thereto without departing from the spirit and scope of the present invention.

What is claimed is:

1. A display device comprising:
   a substrate;
   a first insulating layer disposed on the substrate;
   a wire disposed on the first insulating layer; and
   a second insulating layer disposed on the wire,
   wherein the first insulating layer, the wire, and the second insulating layer extend from an edge of the substrate to overlap a side surface of the substrate.

2. The display device of claim 1, wherein
   each of the first insulating layer and the second insulating layer includes an organic insulating material.

3. The display device of claim 1, wherein
   the wire and the second insulating layer extend to a lower surface of the substrate.

4. The display device of claim 3, wherein
   the first insulating layer does not extend to the lower surface of the substrate.

5. The display device of claim 3, wherein
the substrate includes an inclined surface between the side surface of the substrate and the lower surface of the substrate, and the first insulating layer is in contact with the inclined surface.

6. The display device of claim 3, wherein
the substrate includes an inclined surface between the side surface of the substrate and the lower surface of the substrate, wherein an additional portion is disposed on the inclined surface, and the first insulating layer is in contact with the additional portion.

7. The display device of claim 1, further comprising:
a buffer layer disposed on the substrate,
wherein the first insulating layer is in contact with the buffer layer.

8. The display device of claim 7, wherein
the buffer layer includes a rounded edge, and
the first insulating layer, the wire, and the second insulating layer extend to overlap the rounded edge of the buffer layer.

9. The display device of claim 1, further comprising:
a transistor disposed on the substrate,
wherein the wire is formed of a same material and in a same process as an electrode of the transistor.

10. The display device of claim 9, further comprising:
a planarization layer disposed on the transistor; and
a pixel definition layer disposed on the planarization layer,
wherein the second insulating layer is formed of a same material and in a same process as the planarization layer or the pixel definition layer.

11. The display device of claim 1, further comprising:
a display area displaying an image; and
a non-display area around the display area,
wherein the first insulating layer is disposed in the display area and the non-display area.

12. The display device of claim 1, further comprising:
a display area displaying an image; and
a non-display area around the display area,
wherein the first insulating layer is not disposed in the display area.

13. A method of manufacturing a display device, comprising:
forming a first insulating layer, a wire, and a second insulating layer on a substrate;
removing a part of the substrate to divide the substrate into a substrate of a first display panel and a substrate of a second display panel;
dividing the first insulating layer into a first insulating layer of the first display panel and a first insulating layer of the second display panel;
dividing the wire into a wire of the first display panel and a wire of the second display panel;
bending parts of the first insulating layer, the wire, and the second insulating layer, of the first display panel, protruding beyond the substrate of the first display panel to at least partially surround an edge of the substrate of the first display panel; and
bending parts of the first insulating layer, the wire, and the second insulating layer, of the second display panel, protruding beyond the substrate of the second display panel to at least partially surround an edge of the substrate of the second display panel.

14. The method of manufacturing the display device of claim 13, wherein the removing of the part of the substrate includes etching the substrate.

15. The method of manufacturing the display device of claim 14, further comprising:
forming a buffer layer on the substrate before forming the first insulating layer on the substrate,
wherein the buffer layer is etched during the etching of the substrate.

16. The method of manufacturing the display device of claim 15, wherein the buffer layer includes an inorganic insulating material, and each of the first insulating layer and the second insulating layer includes an organic insulating material.

17. The method of manufacturing the display device of claim 13, wherein the dividing of the first insulating layer includes removing a part of the first insulating layer, and the part of the first insulating layer to be removed is disposed within a region where the part of substrate is removed.

18. The method of manufacturing the display device of claim 13, wherein the first insulating layer of the first display panel is in contact with a side surface of the substrate of the first display panel by the bending of parts of the first insulating layer, the wire, and the second insulating layer of the first display panel.

19. The method of manufacturing the display device of claim 13, wherein the substrate of the first display panel includes an inclined surface, and
the first insulating layer of the first display panel is in contact with the inclined surface by the bending of parts of the first insulating layer, the wire, and the second insulating layer of the first display panel.

20. The method of manufacturing the display device of claim 13, wherein the first display panel includes a display area displaying an image and a non-display area around the display area, and
the first insulating layer is formed in the display area and the non-display area.

* * * * *